United States Patent [19]

Harger

[11] Patent Number: 4,539,711
[45] Date of Patent: Sep. 3, 1985

[54] TUNING CONTROL SYSTEM FOR A PAIR OF TUNERS EMPLOYING A COMMON CHANNEL SKIP MEMORY

[75] Inventor: Mark A. Harger, Noblesville, Ind.

[73] Assignee: RCA Corporation, Princeton, N.J.

[21] Appl. No.: 490,720

[22] Filed: May 2, 1983

[51] Int. Cl.³ .............................................. H04B 1/16
[52] U.S. Cl. ................................. 455/166; 358/191.1;
358/194.1; 455/151; 455/186
[58] Field of Search ............... 455/151, 166, 185, 186, 455/168, 180; 358/194.1, 191.1

[56] References Cited

U.S. PATENT DOCUMENTS

| | | | |
|---|---|---|---|
| 4,131,853 | 12/1978 | Dreiske | 455/185 |
| 4,267,563 | 5/1981 | Sato et al. | 358/191.1 |
| 4,326,220 | 4/1982 | Mogi | 358/191.1 |
| 4,355,415 | 10/1982 | George et al. | 455/185 |
| 4,375,651 | 3/1983 | Templin et al. | 455/186 |
| 4,488,179 | 12/1984 | Krüger et al. | 358/191.1 |

FOREIGN PATENT DOCUMENTS 2003347 3/1979 United Kingdom.
2087613 5/1982 United Kingdom ................ 455/151

Primary Examiner—Marc E. Bookbinder
Attorney, Agent, or Firm—Eugene M. Whitacre; Paul J. Rasmussen; Peter M. Emanuel

[57] ABSTRACT

The use of a single skip list memory for two or more tuners is made possible by indexing the starting point of a scanning selection operation to the last channel tuned by the tuner which is to be controlled.

4 Claims, 14 Drawing Figures

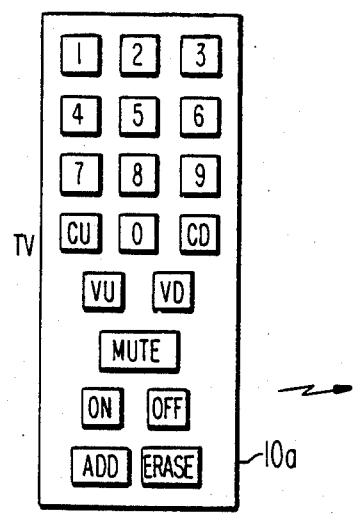
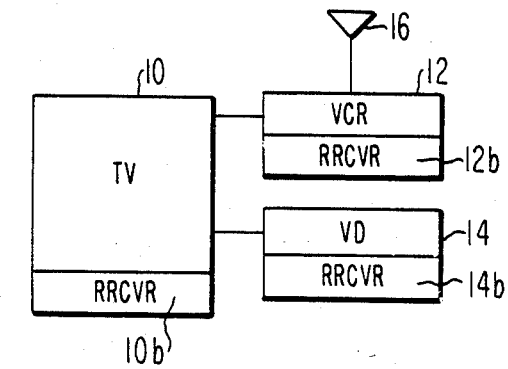
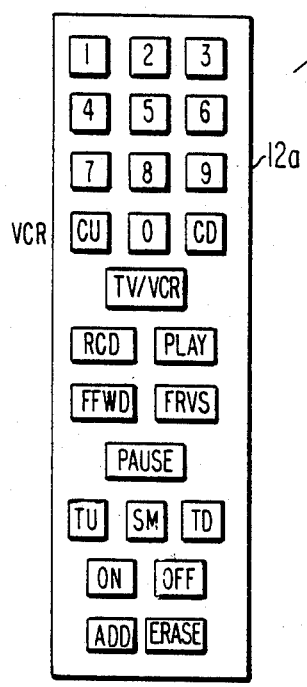
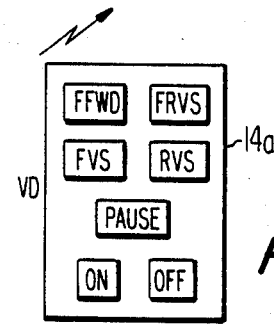
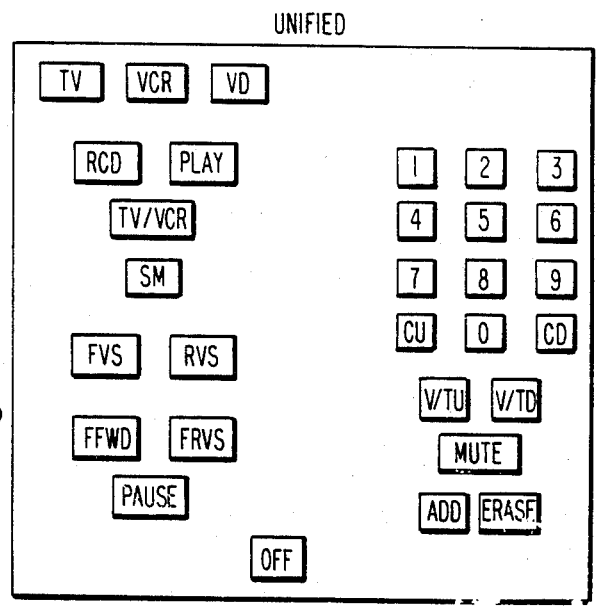
Fig. 1
Fig. 2

REMOTE CONTROL TRANSMITTER PROGRAM

READ STRAP TO DEFINE XMITTE TYPE ROUTINE

TRANSMIT ROUTINE

DIRECT ENTRY ROUTINE

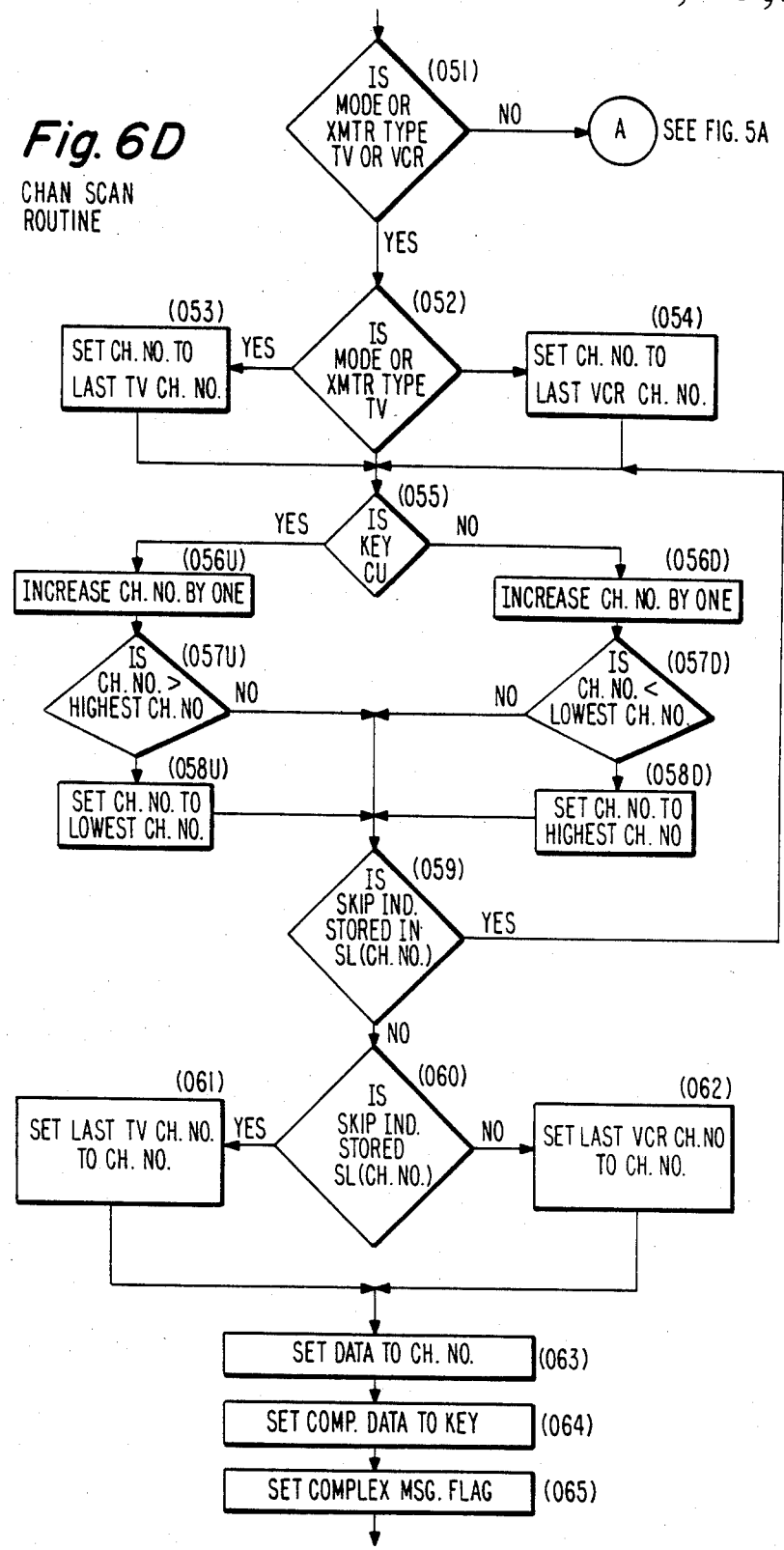

ADD/ERASE ROUTINE

REMOTE CONTROL RECEIVER PROGRAM

COMPLEX MSG ROUTINE

TUNING CONTROL SYSTEM FOR A PAIR OF TUNERS EMPLOYING A COMMON CHANNEL SKIP MEMORY

BACKGROUND OF THE INVENTION

1. Field of the Invention

The present arrangement concerns a channel selection arrangement for the tuners of two or more receiving devices, such as television receivers and video cassette recorders, which is preferably incorporated in a common or unified remote control transmitter. In particular, the invention concerns a so called "skip memory" arrangement storing a list of channels to be "stepped over" during a scanning type channel selection operation which can be used for controlling the channel selection of two or receiving devices.

2. Description of the Related Art

Manufacturers have traditionally provided remote control systems for television receivers. As the popularity of television accessories such as video cassette recorders and video disc players has grown, manufacturers have also started to provide individual remote control systems for the television accessories. As a result, a user may have three or more individual remote control transmitters. The use of individual remote control transmitters is cumbersome. Moreover, the cost of a remote control arrangement where each television device has its own remote control transmitter is expensive to the user. Accordingly, a single, unified remote control transmitter which is capable of controlling more than one television device is highly desirable for users which own a number of television devices with remote control provisions.

The ability to select channels by depressing either a "channel up" or "channel down" key is a common feature in remote control systems for television receivers and is also starting to be used in remote control systems for video cassette recorders. Such systems often include a "skip memory", for storing a list indicating those channels which are preferred and those channels which are not preferred, i.e., those which are to be "skipped" over, in channel selection. When a user depresses a "channel up" or the "channel down" key, memory locations of the skip memory corresponding to respective channels are sequentially addressed and then interrogated until a memory location is reached in which an indication that the respective channel is preferred is reached. At that point, the search stops and the channel corresponding to the presently addressed memory is tuned.

SUMMARY OF THE INVENTION

It is herein recognized that when such channel scanning provisions are included in a unified remote control transmitter for controlling the channel selection of two or more receiving devices such as the tuners of a television receiver and a video cassette recorder, it is desirable that only a single skip memory arrangement be needed in order to conserve memory space.

Specifically, in accordance with an aspect of the present invention, a channel scanning arrangement for a common or unified control system for the tuners of two or more receiving devices includes a memory for storing a single skip list and memory locations for storing the last channels tuned by the respective tuners. When a particular tuner is selected for tuning, the respective last channel is recalled from its memory location and the channel scanning operation is started from that point. When the next channel in the skip list is located that channel is tuned and stored in the respective last channel memory location. In short, the invention concerns a common skip list for two or more tuners which is indexed so that the channel scanning operation starts at different channels depending on which of the tuners was last selected for tuning.

BRIEF DESCRIPTION OF THE DRAWING

These and other features of the present arrangement are described with reference to the accompanying Drawing in which:

FIGS. 1 and 2 show, in pictorial form, individual and unified remote control transmitters for controlling a television receiver, video cassette recorder and video disc player which is useful in understanding the type of remote control messages that must be generated by each;

FIGS. 5A–5B and 6A–6E show, in flow chart form, the control program for the microcontroller included within the remote control transmitter arrangement shown in FIG. 3.

DESCRIPTION OF THE PREFERRED INVENTION

Figures 3, 3A:
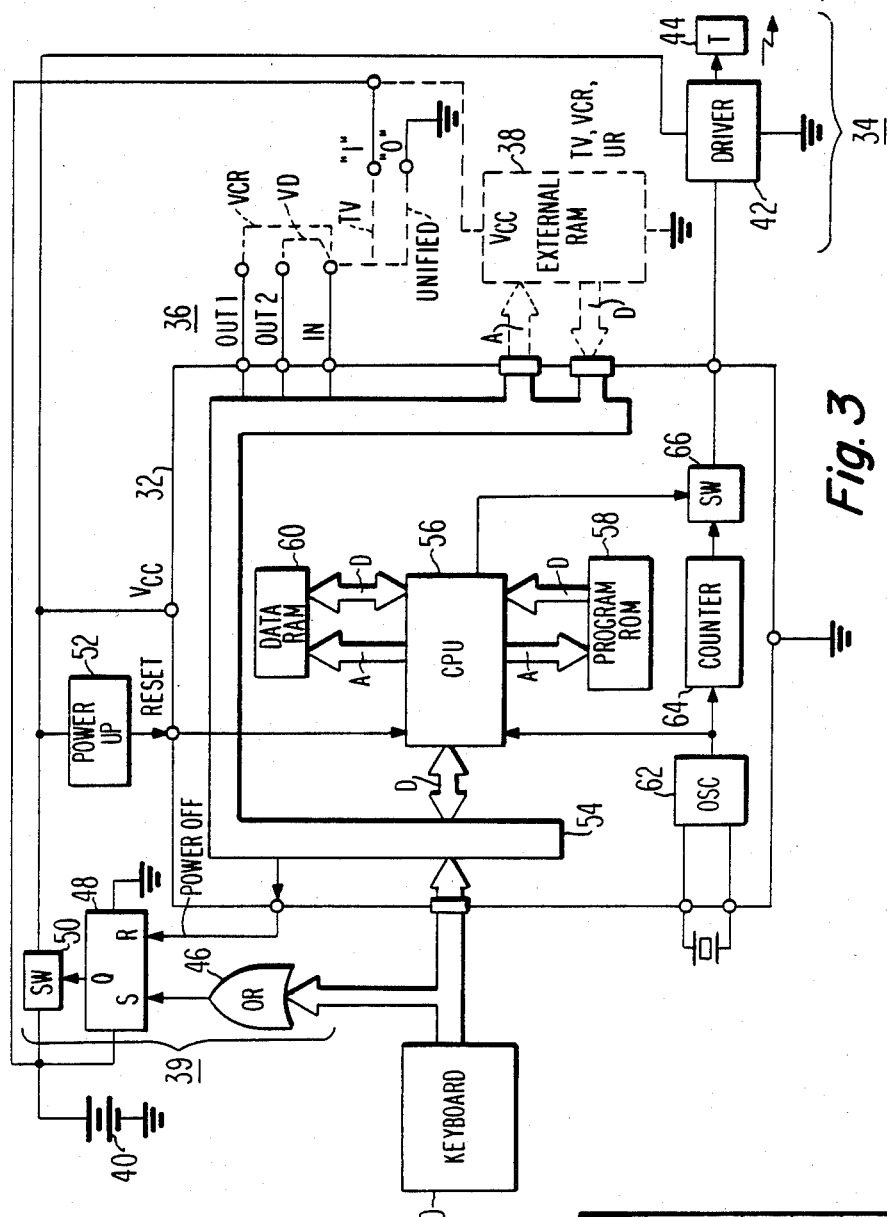
FIG. 3 shows, in block form, a remote control transmitter arrangement, constructed in accordance with the present invention, for inclusion in all the remote control transmitters shown in FIGS. 1 and 2.
FIG. 3A shows, in pictorial form, the contents of the external memory included within the remote control transmitter arrangement shown in FIG. 2.

In FIG. 1, a television receiver (TV) 10 receives television signals from video cassette recorder player (VCR) 12 and video disc player (VD) 14 for reproduction. Typically, the television signals are RF signals but they can also be video signals. An RF source 16 (which may be an antenna, as shown, or a cable distribution network) provides RF signals to VCR 12. TV 10 and VCR 12 include respective tuners. A switching arrangement is included within VCR 12 for selectively coupling the signals to only the tuner of TV 10 or to both the tuner of TV 10 and the tuner of VCR 12. In the latter state, one channel can be reproduced by TV 10 while another is being recorded by VCR 12.

Individual remote control transmitters 10a, 12a and 14a are provided for controlling various functions of TV 10, VCR 12 and VD 14. The remote control messages generated by individual remote control transmitters 10a, 12a and 14a are provided for controlling various functions of TV 10, VCR 12 and VD 14. The remote control messages generated by individual remote control transmitters 10a, 12a and 14a are received and processed by remote control receiver (RCRCVR) sections 10b, 12b and 14b of TV 10, CVR 12 and VD 14, respectively, to control the devices in accordance with the remote control messages.

The remote control messages are generated when a user depresses respective keys of a remote control transmitter. By way of example, the following tables indicate the functions of TV 10, VCR 12 and VD 14 which are controlled when respective keys of transmission 10a, 12a and 14a are depressed.

TABLE 1

TV FUNCTIONS

| KEY | FUNCTION |
|---|---|
| ON | Turn TV on |
| OFF | Turn TV off |
| CU | "Channel up" - tune TV tuner to next higher channel in a "skip list" indicating which channels are to be tuned and which channels are to be "skipped over" |
| CD | "channel down" - tune TV tuner to next lower channel in skip list |
| 0-9 | the sequential depression of two "digit" keys causes the channel with the resulting two digit channel number to be tuned |
| VU | "volume up" - increase the audio volume level |
| VD | "volume down" - decrease the audio volume level |
| MUTE | mute the sound; when depressed a first time sound is muted and when depressed a second time sound is "unmuted" |
| ADD | add the presently tuned channel to the channel list |
| ERASE | remove the presently tuned channel from the channel list |

TABLE 2

VCR FUNCTIONS

| KEY | FUNCTION |
|---|---|
| ON, OFF, CU, CD, 0-9, ADD and ERASE | same as for TV except for VCR |
| TV/VCR | when depressed a first time, couples the RF source to only the tuner of the VCR; when depressed a second time, couples the RF source to the tuners of both the TV and VCR (for watching channel while recording another) |
| RCD | record |
| PLAY | play |
| FFWD | fast forward - rapidly advance tape |
| FRVS | fast reverse - rapidly rewind tape |
| PAUSE | stop tape motion |
| SM | slow motion - motion in picture slowed |
| TU | adjust tape synchronization tracking in upward sense for slow motion |
| TD | adjust tape synchronization in downward sense for slow motion |

TABLE 3

VD FUNCTIONS

| KEY | FUNCTION |
|---|---|
| ON, OFF, FFWD, FRVS and PAUSE | same as for VCR except for VD |
| FVS | "forward visual search" - while a picture is produced, the disc is turned more rapidly than normal playing speed in the forward direction to allow a visual search for a particular location |
| RVS | "reverse visual search" - while a picture is produced, the disc is turned more rapidly than normal playing speed but in the reverse direction to allow a visual search |

A unified remote control transmitter 20 for controlling TV 10, VCR 12 and VD 14 shown in FIG. 1, is shown in FIG. 2. Since many of the keys are used to control more than one device, unified remote control transmitter 20 includes device selection keys TV, VCR and VD for determining which one of TV 10, VCR 12 or VD 24 is to be controlled. The following table indicates the function or functions of the keys of unified remote control transmitter 20. As is indicated, some functions depend on which device key has been previously depressed while others unconditionally control a particular device independent on which device key has been previously depressed. Still other functions depend on which device and function keys have been previously depressed. It will also be noted that there is no ON key. This is so because the selection of a device key will automatically cause the respective device to be turned on.

TABLE 4

UNIFIED REMOTE FUNCTIONS

| KEY | FUNCTION |
|---|---|
| TV | select TV to be controlled |
| VCR | select VCR to be controlled |
| VD | select VD to be controlled |
| 0-9 | depending on which of the TV or VCR keys has been depressed, causes the TV or VCR channel selected by sequentially depressing the tens and units digit keys of desired channel number to be tuned |
| CU | depending on which of TV or VCR keys has been depressed, tunes the next higher TV or VCR channel |
| CD | depending on which of TV or VCR keys has been depressed, tunes the next lower TV or VCR channel |
| ADD | add the presently |

TABLE 4-continued
UNIFIED REMOTE FUNCTIONS

| KEY | FUNCTION |
|---|---|
| | tuned channel to a skip list |
| ERASE | remove the presently tuned channel from a skip list |
| V/TU | increase volume level unless VCR and SM keys have been previously depressed; in the latter case, change the VCR synchronization tracking in the "upward" sense |
| V/TD | decrease volume level unless VCR and SM keys have been previously depressed; in the latter case, change the VCR synchronization tracking in the "downward" sense |
| MUTE | unconditionally mute the TV audio volume levels |
| RCD | if the VCR key has been previously depressed, causes VCR to record |
| PLAY | if the VCR key has been previously depressed, causes VCR to play |
| TV/VCR | if VCR key has previously been depressed, upon first depression, couples RF source only to VCR tuner; upon second depression, couples RF source to both the TV tuner and to VCR tuner |
| SM | if VCR key has been previously depressed, activates the slow motion feature |
| FVS | if VD key has been previously depressed, causes a forward visual search |
| RVS | if VD key has been previously depressed, causes a reverse visual search |
| FFWD | if VCR key has been previously depressed, causes VCR to rapidly advance the tape; if VD key has been previously depressed, causes VD to rapidly advance the disc position |
| FRVS | if VCR key has been previously depressed, causes VCR to rapidly rewind the tape; if VD key has been previously depressed, causes VD |
| PAUSE | to rapidly return the disc position depending on which of VCR or VD keys has been depressed, causes either VCR or VD to pause |
| OFF | causes the last device selected to turn off |

FIG. 3 is a schematic of a remote control arrangement which can be used in any of the individual remote control transmitters shown in FIG. 1 or in the unified remote control transmitter shown in FIG. 2. Basically, it includes a keyboard 30 by which a user may enter commands, a microcontroller 32 for forming remote control messages in response to the commands entered by means of keyboard 30, and a driver section 34 for transmitting the remote control messages to a remote control receiver. Microcontroller 32 operates under the control of a stored program which is always the same, i.e., is independent of the type of remote control transmitter. Driver section 34 is also always the same. Accordingly, a significant part of all the remote control transmitters is the same. This reduces the parts inventory and testing required to manufacture the four different types of remote control transmitters and consequently the cost to both the manufacturer and consumer.

Keyboard 30 is selected in accordance with the type of remote control transmitters. However, the key codes for keys common to both an individual remote control transmitter and the unified remote control transmitter are the same.

To identify the type of remote control transmitter, certain input and output terminals of microcontroller 32 are selectively connected, i.e., "strapped", by the manufacturer either to each other, to the supply voltage (VDD) conductor, or to the reference voltage (ground) conductor in a strap configuration 36. Strap configuration 36 is examined, i.e., "read", by microcontroller 32 to determine the action to be taken in response to the activation of the keys. Specifically, the remote control messages include a preamble portion which identifies the device to be controlled and a data portion which identifies the function to be controlled. If the transmitter is an individual one (10a, 12a or 14a in FIG. 1), strap configuration 36 determines the preamble portion of the remote control message. If the transmitter is a unified one (10 in FIG. 1), strap configuration 36 determines the preamble, and possibly the data portion, in accordance with the contents of an external memory 38. External memory 38 also stores information, such as the skip list referred to above. These and other features will be described in greater detail with reference to the flow chart of the control program shown in FIGS. 5A–B and 6A–E.

Now specifically with reference to FIG. 3, the switches of the various keys of keyboard 30 are coupled to a power supply switching circuit 39, in addition to microcontroller 32. When a key of keyboard 30 is depressed, power supply switching circuit 39 is caused to couple a supply voltage from a battery 40 to the rest of the remote control transmitter, including microcontroller 32. Microcontroller 32 responds to the depressed key by generating a digital word representing the appropriate remote control message. A carrier signal is modulated in accordance with the remote control message representative word within microcontroller 32, in the manner to be described below, and coupled to a driver-amplifier 42 of driver section 34. The modulated carrier is amplified by a driver-amplifier 48 and applied to a transducer 44. Transducer 44, which may comprise an infrared light emitting diode, transmits the modulated carrier.

Power supply switching circuit 39 includes an "OR" function gate 46, a set-reset flip-flop (S-R FF) 48 and an electronic switch 50. When any one of the keys of keyboard 10 is depressed, S-R FF 48 is "set" whereby a high logic level (or logic "1") is developed at its Q output. Normally, non-conductive electronic switch 50 is rendered conductive in response to logic "1" produced at the Q output of S-R FF 48. As a result, the supply voltage provided by a battery 40 is coupled to a supply voltage input (labeled $V_{cc}$) of microcontroller 32 and to respective supply voltage inputs of driver-amplifier 42. When the depressed key is released, after microprocessor 12 has caused the remote control message corresponding to the depressed key to be transmitted, it generates a "power off" signal (a logic "1") which causes S-R FF 48 to be "reset" whereby a logic "0" is developed at its Q output. In response, switch 50 is rendered "non-conductive" and the supply voltage from battery 40 is decoupled from microcontroller 32 and driver-amplifier 42. Thus, after the depressed key is released, the transmitter is only energized long enough for the remote control command to be transmitted after a key is depressed. This increases the lifetime of battery 40.

The output side of switch 50 is also coupled to a "power up" detector 52 which in turn has an output coupled to a "reset" input of microcontroller 32. When a key of keyboard 30 is depressed and switch 50 is, as a result, rendered conductive to couple supply voltage to microprocessor 32, power up detector 30 generates a "reset" pulse. In response to the reset pulse, the control program for micro controller 32 is initiated as will be described below.

Microcontroller 32 includes input and output (I/O) ports 54 by which data (in digital form) is received from and coupled to external devices. A central processing unit (CPU) 56 controls the transfer and processing of data under the control of a program stored in a read-only memory (ROM) 58. For this purpose CPU 56 addresses ROM 58, reads the instruction stored at the addressed memory location and processes or transfers data according to the instruction. During this operation memory locations of an internal volatile random access memory (RAM) 60 are used to temporarily store data as it is processed. CPU 56 addresses RAM 60 and transfers data to and from the addressed memory location of RAM 60.

Timing signals for microcontroller 32 are derived from the output signal of a crystal oscillator 62. The frequency of oscillator 62 is also divided by a counter 64 to derive the carrier signal. The carrier signal is coupled to an electronic switch 66 the conduction of which controlled by the bits (binary digits) of the remote control message representative word to derive the modulated carrier which is coupled to driver-amplifier 42.

External RAM 38 is included in the individual remote control transmitters (10a and 12a of FIG. 1) for the television receiver and the video cassette recorder and in the unified remote control transmitter (20 of FIG. 2) but not in the individual remote control transmitter (14a of FIG. 1) for the video disk player and is therefore indicated with phantom lines.

External RAM 38 is used to store a list of preferred and non-preferred channels, i.e., a "skip list", the last device selected for control in the case of the unified remote control transmitter, and other data as well as other data indicated in FIG. 3A. This will be discussed in greater detail with respect to the flow chart of the control program stored shown in FIGS. 5A-B and 6A-E. CPU 56 addresses RAM 38 and transfers data to and from the addressed memory location.

Battery 40 is directly connected to the supply voltage input ($V_{cc}$) of RAM 38 rather than through switch 50 so that the contents of RAM 38 are maintained when the remote control transmitter is off, i.e., when none of its keys are depressed.

The COP 420L microprocessor available from National Semiconductor Corp., Santa Clara, Calif., is a suitable choice for microcontroller 32 and the COP 499 RAM, also available from National Semiconductor Corp., is a suitable choice for RAM 38. The COP 420L microprocessor is constructed with NMOS (N-channel metal-oxide semiconductor) devices and therefore is particularly well suited since CMOS devices are relatively small amounts of energy.

Figure 4:
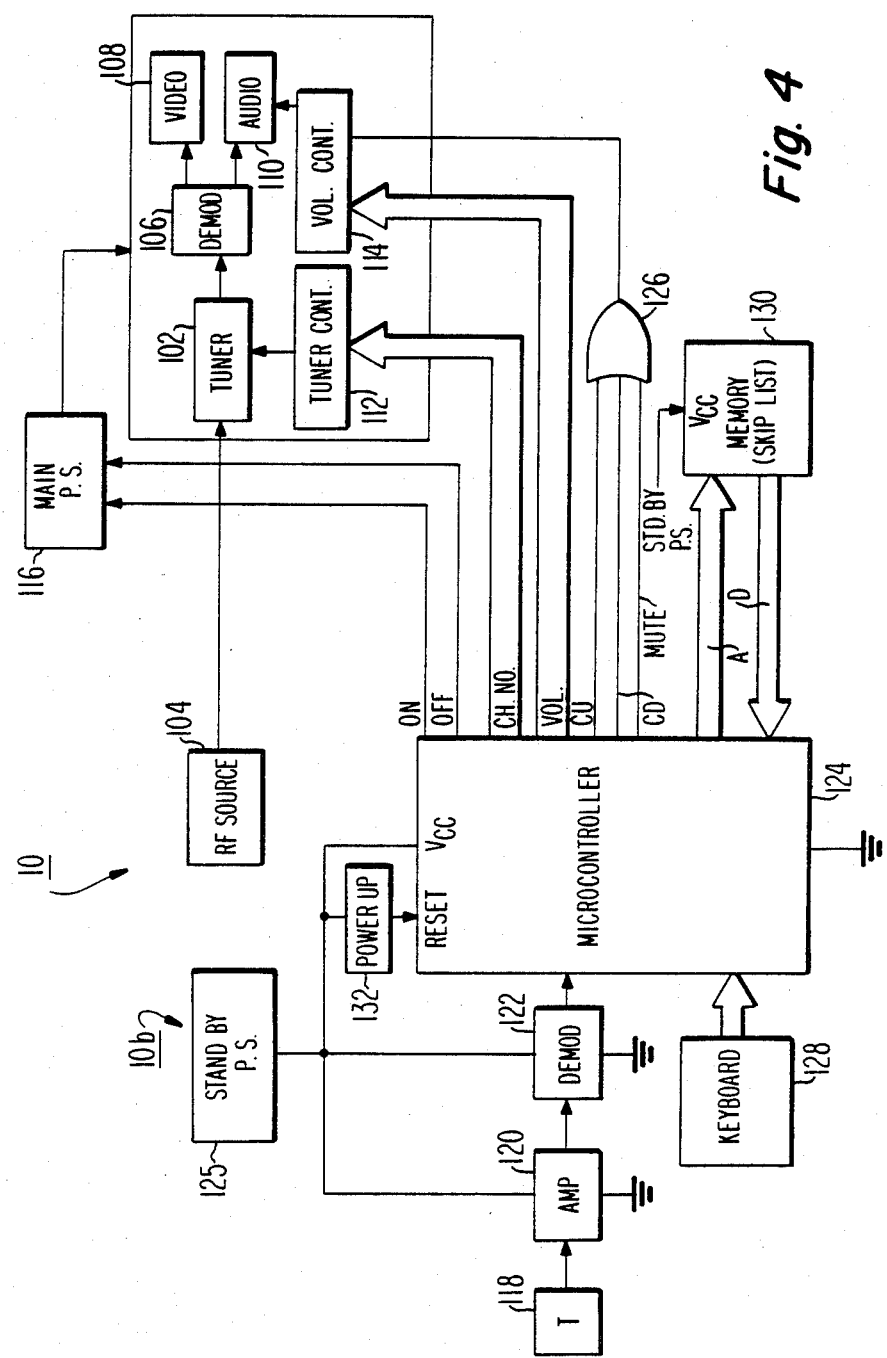
FIG. 4 shows, in block form, the remote control section of a television receiver controlled by the television remote control transmitter shown in FIG. 1 and the unified remote control transmitter shown in FIG. 2.

A schematic of remote control receiver section 10b of TV 10 shown in FIG. 1 is shown in FIG. 4. While remote control sections of VCR 12 and 14b of VD 14 are generally similar, the television remote control section has been illustrated so that the function of certain complex remote control messages discussed with respect to FIGS. 5A-C and 6A-D will be better understood.

In FIG. 4, television receiver 10 includes a signal processing section 102 including a voltage controlled tuner 102 for converting the RF signal for a selected channel received from an RF source 104 (such as antenna 16 or VCR 14 shown in FIG. 1) to a corresponding IF signal. The IF signal is demodulated by a demodulator 106 to produce video and audio signals which are processed in respective sections 108 and 110. A tuner control unit 110 generates a tuning control voltage for tuner 102 in accordance with the channel number the selected channel stored, in digital form, in an internal register. A volume control unit 114 generates a volume control voltage for controlling the audio volume level in accordance with a volume level representative digital word stored in an internal register. The volume may be "muted" in response to a "mute" command signal. A main power supply 116 selectively provides operating voltages to signal processing section 100 in response to "on" and "off" command signals.

Remote control receiver section 10b includes a transducer 118 from converting received remote control messages to a corresponding electrical signal and an amplifier 120 for amplifying these signals. A demodulator, which may simply comprise an envelop detector, produces a digital word representing in serial form the remote control message in response to the electrical signal provided by amplifier 120. The remote control message is examined by a microcontroller to generate the "on", "off" and "mute" command signals and the channel number and volume representative digital words. Basically, microcontroller 124 examines the preamble of the remote control message to determine if it is correct and if it is thereafter decodes the data portion of the remote control message to produce the various command and control level representative digital word signals. A standby power supply 125 continually provides supply voltages to the various portions of remote control receiver section 102 so that remote control receiver 10b is always in a condition to receive remote control messages and so that the on, off and mute commands and the channel number and volume level representative digital words are maintained when signal processing section 100 is "off".

As will be described in greater detail below, when a television channel is selected by means of the CU and CD keys, the remote control message has a complex form including both the channel number and either the channel up or channel down command (depending on whether the CU or the CD key was depressed). The purpose of this is to enable the audio to be muted while a channel is being changed. The complex remote control message is decoded by microcontroller 124 of TV remote control section 10b to derive the channel number and the appropriate one of a CU or CD signal. The CU or CD signal is coupled through an OR function circuit 126 (the function of which may be performed by microcontroller 124) to the mute control input of volume control unit 114. When a television channel is selected by means of the digit keys, the digits of the channel number are transmitted one at a time and the complete channel number is formed by microcontroller 124 when both digits have been received. At that time microcontroller 112 itself generates a mute signal which is coupled through OR function gate 126 to volume control unit 114. The mute signal generated when the MUTE key of the remote control transmitter is depressed is also coupled to the mute control input of volume control unit 114 through OR function circuit 126. The latter allows audio to be muted at anytime as desired.

Figure 5A:
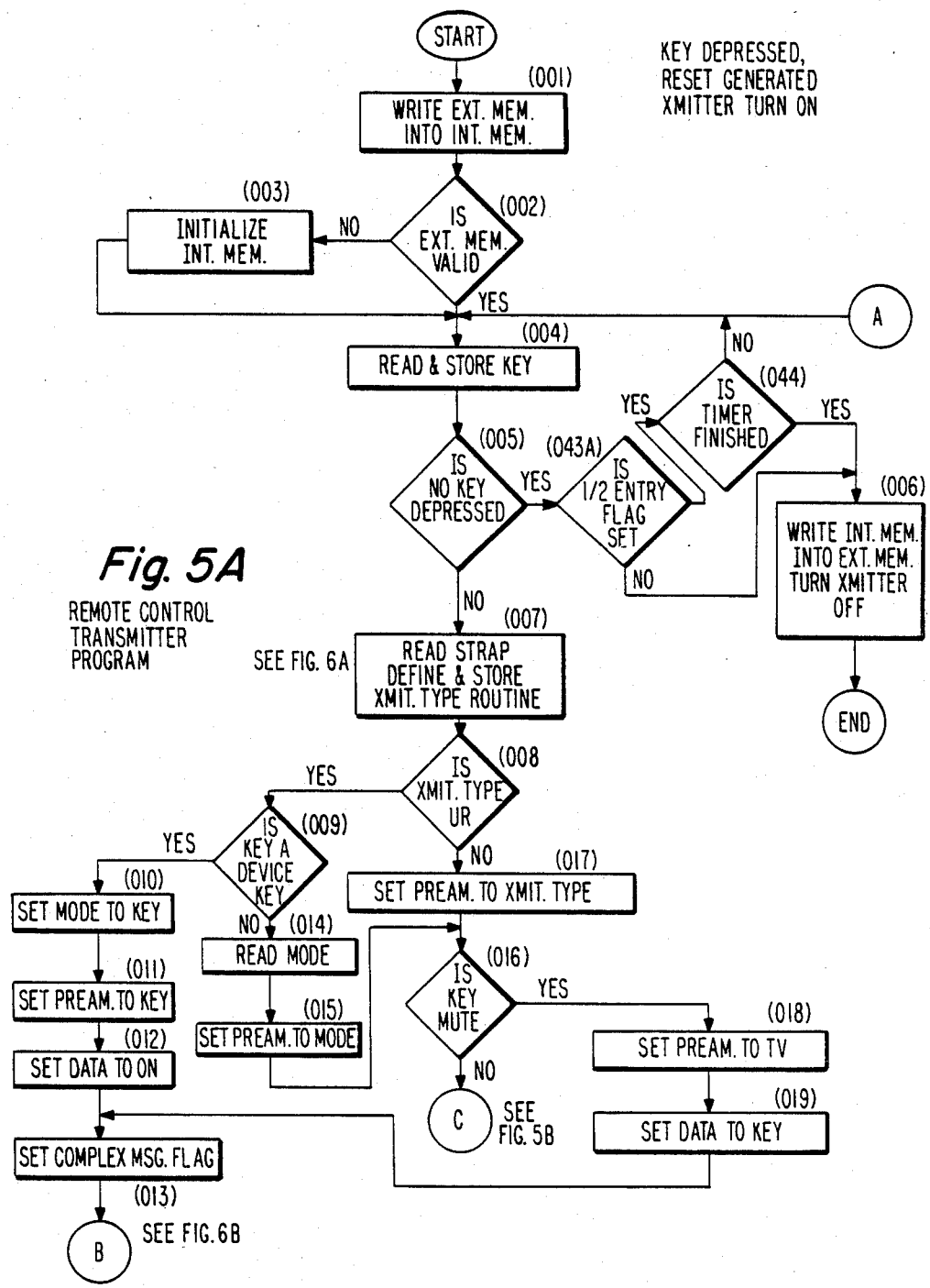

Turning now to the flow chart starting in FIG. 5A, the control program is initiated when a key is depressed and a reset signal is applied to the reset input of microcontroller 32. The contents of the memory location of external RAM 38 are read into corresponding memory locations of internal RAM 60 (001). The contents of a particular memory location (identified as VALID MEMORY in FIG. 3A) in which a predetermined validity constant should have been stored, if the supply voltage to external RAM 38 was not disturbed, are examined to determine if the contents of external RAM 38 have been maintained (002). If the contents of external RAM 38 have not been maintained, certain initialization data is loaded into the memory locations of internal RAM 60 corresponding to those of external RAM 38 (003) as follows:

set correct validity constant
set skip list to indicate all channels are preferred
set last TV and VCR channel numbers to the lowest channel number (e.g., 02)
set the mode to TV If the contents of external RAM 38 have been maintained or after the contents of external RAM are set as indicated above, the keyboard is read (004). If no key has been depressed (005) and a predetermined time delay has not expired (as determined in 044, the purpose of which will be described with reference to FIG. 6C), the contents of external RAM 38 are loaded from the contents of the corresponding memory locations of internal RAM 60 and the transmitter is turned off (006). This ends the program.

The contents of external RAM 38 are read into internal RAM 60 at the beginning of the program to increase the speed at which data can be processed since it takes considerably more time to read and write data from and into external RAM 38 than from and into internal RAM 60.

It is noted that although external RAM 38 is not present in a VD transmitter, since the program is the same for all the transmitters, coded memory address signals will still be provided at the appropriate output ports to carry out the above operations.

If a key has been depressed (005) strap configuration 36 is examined to identify the type of remote control transmitter (007). This portion of the program is shown in detail in FIG. 6A.

If the remote control transmitter is a unified one (008), an examination is made to determine if the key that was depressed is a device key, i.e., a TV, VCR or VD key (009). If key was a device key, the mode is set to the corresponding device and stored in its corresponding memory location (010), the preamble portion of the remote control message is also set to the corresponding device (011) and the data portion of the remote control message is set to the "on" function (012). Then, after clearing a flag register (013) the contents of which are used to indicate whether or not a complex remote control message is to be transmitted as described below, the remote control message is caused to be transmitted (starting at point B) in the portion of the program shown in detail in FIG. 6B. This causes the device selected to be turned on. Thereafter, the program returns to point A to wait for the next key to be depressed.

If the remote control transmitter is a unified one (008), but the key that was depressed is not a device key (009), the mode of operation is determined by the last device key which was depressed which is stored in the mode memory location. Accordingly, the contents of the mode memory location (014) are read and the preamble is set in accordance with the contents (015). Thereafter an examination is begun (at 016) to determine which function key was depressed in order to generate the data portion of the remote control message.

If the transmitter is not a unified one (008), the preamble is set in accordance with the type of the transmitter, i.e., TV, VCR or VD (017) as identified by strap configuration 36 and an examination is begun (starting at 016) to determine which function key was depressed to generate the data portion of the remote control message.

The determination of which function key was depressed begins with a determination of whether the function key was the mute key (016). If it was the mute key, the preamble is set to TV (018) and the data is set in accordance to the depressed key (019), i.e., mute. After the complex message flag is cleared (013) the remote control message is transmitted (starting at point B). Thus, when the mute key is depressed the audio output of the television receiver is unconditionally muted.

Figure 5B:
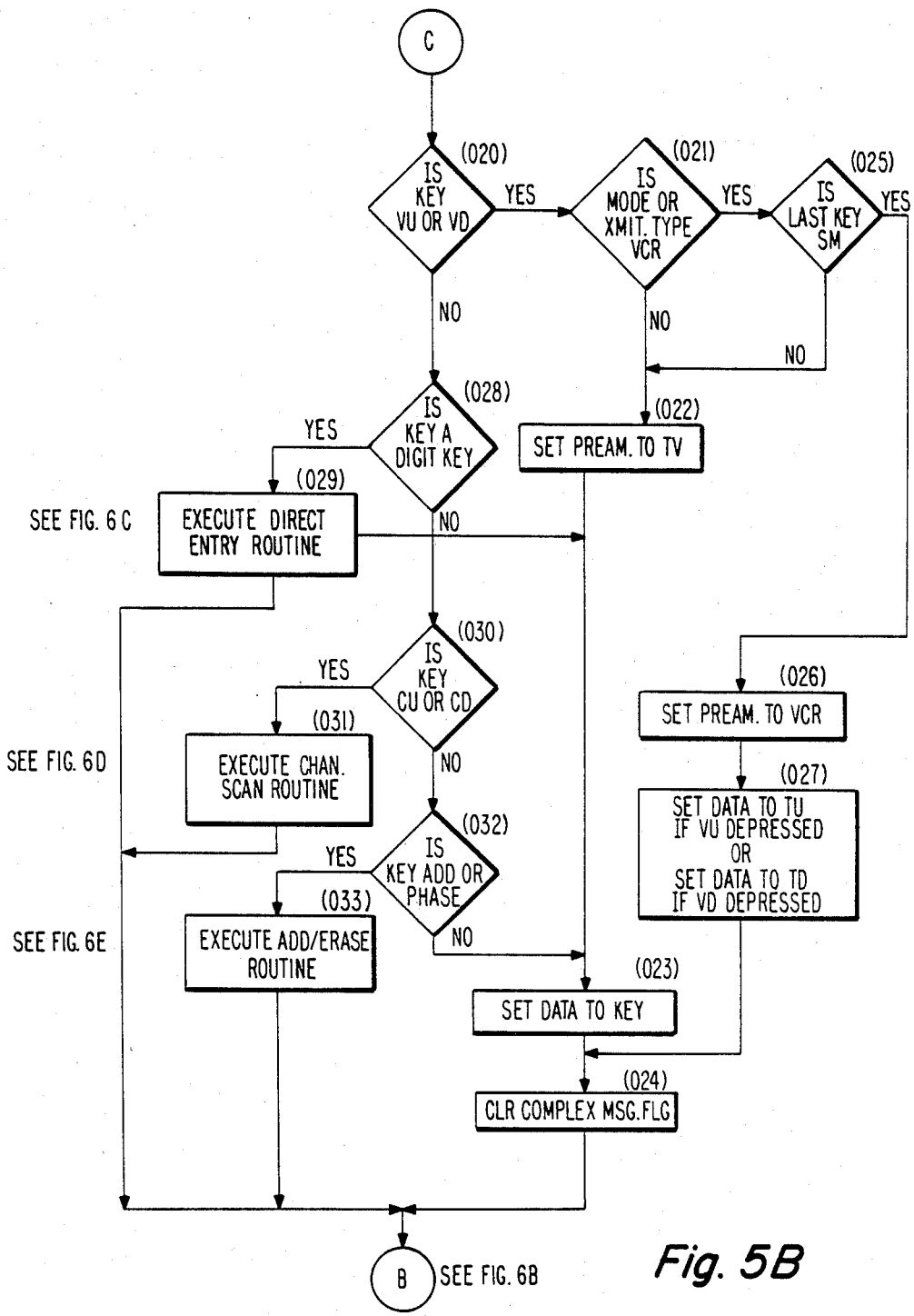

If the mute key was not depressed, the examination of the function key that was depressed continues (from point C) in the portion of the portion of the program shown in FIG. 5B.

If the depressed key was either the VU or VD keys (020), the mode and transmitter type are examined to determine if either corresponds to VCR (021). If not, the preamble is set to TV (022) and the data is set in accordance with the depressed key, i.e., VU or VD (023). After the complex message flag is cleared (024) the remote control message is transmitted (starting at point B).

If the depressed key was VU or DV (020) and the mode or type is VCR (021) the last key (before the present one) is examined (025). If it was the SM (slow motion) lkey, the preamble is set to VCR (026) and the data is set to TU (track up) or TD (track down) depending on whether the VU or VD was depressed (027). After the complex message flag is cleared (024) the remote message control message is transmitted (starting at point B).

Figure 6A:
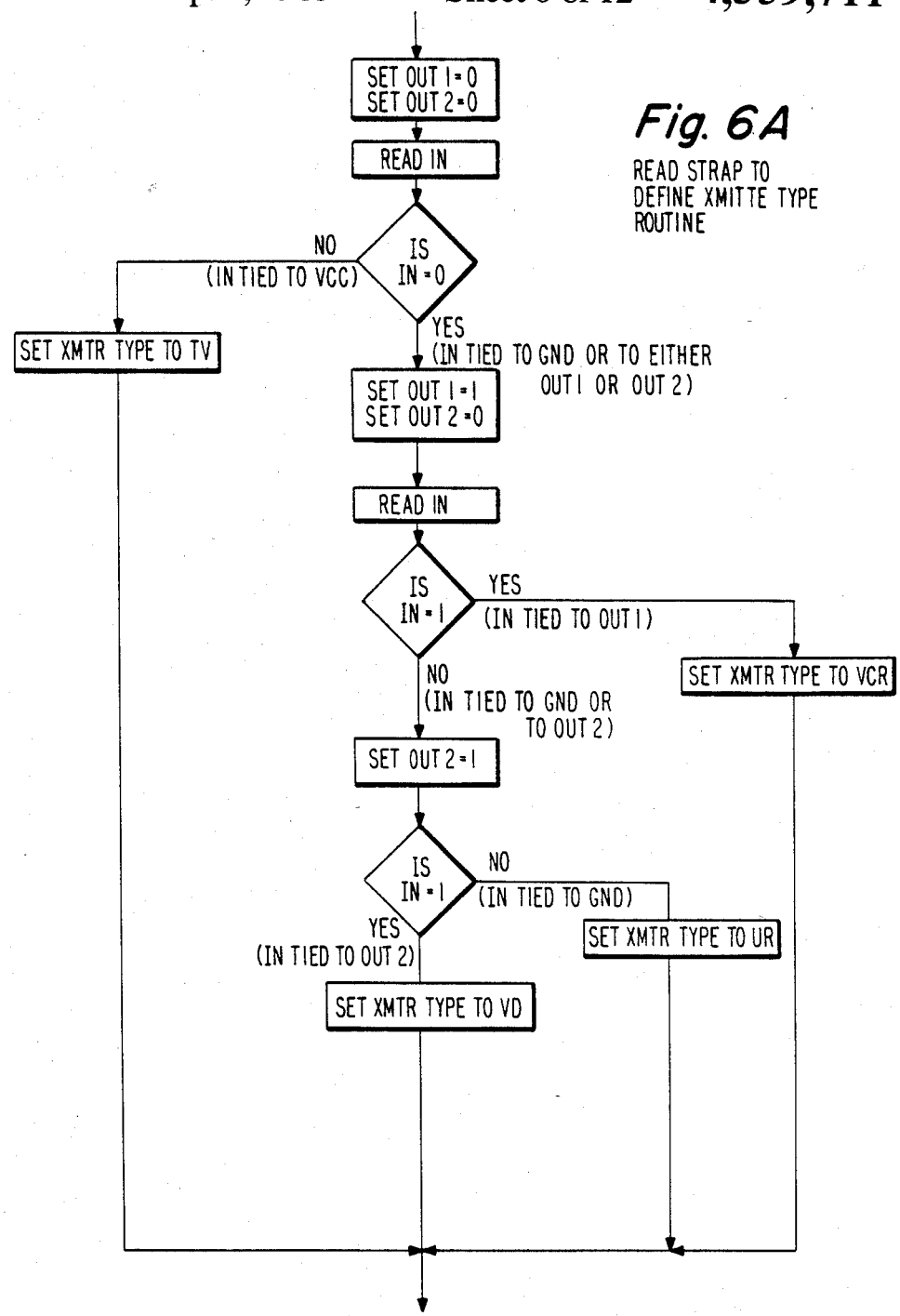
Figure 6B:
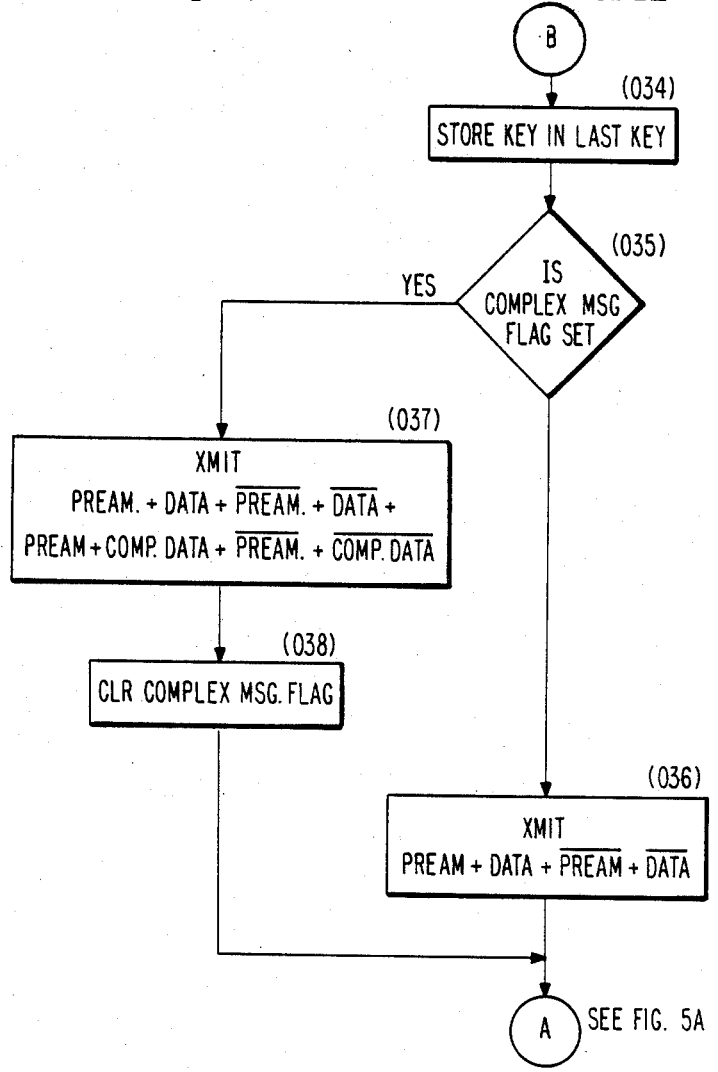
Figure 6C:
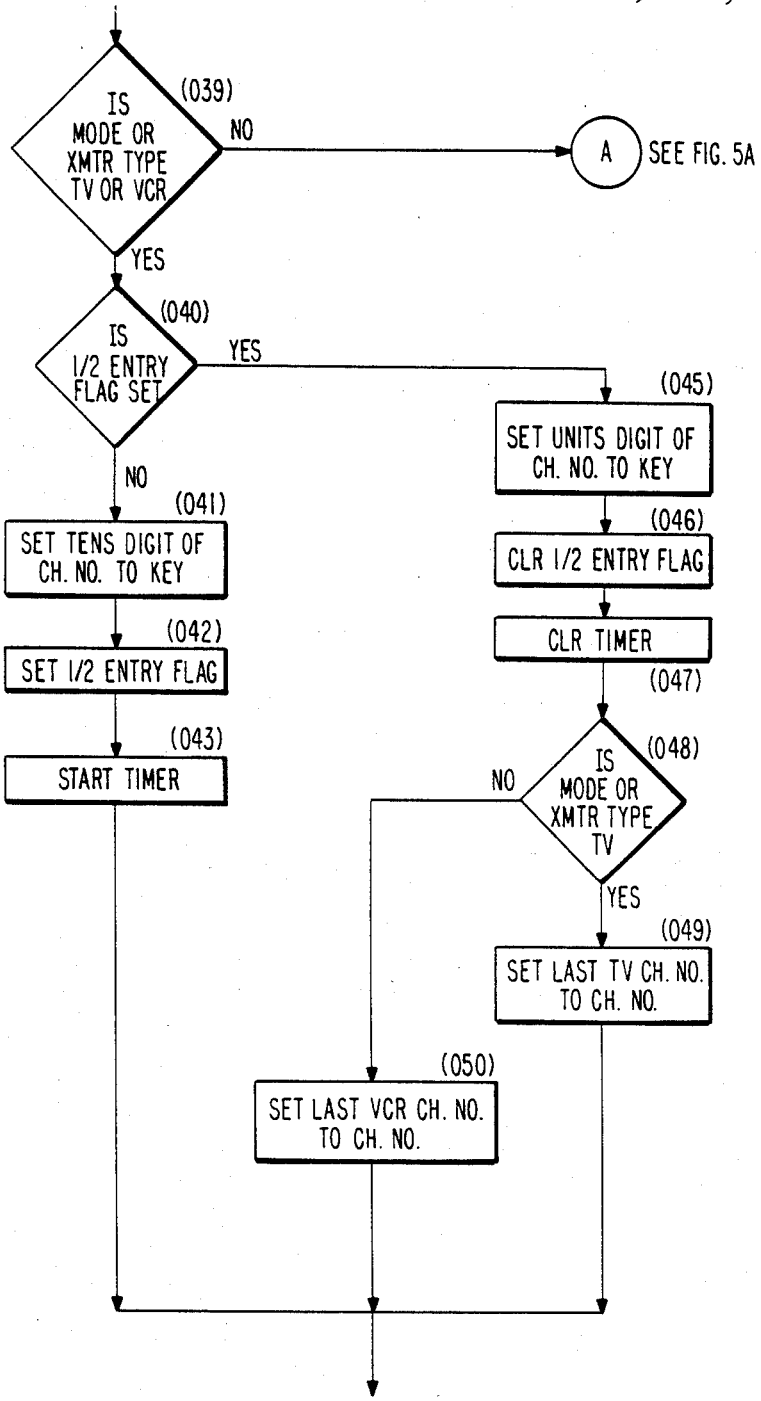

If the depressed key was a digit key (028), a direct entry portion of the program (029) shown in detail in FIG. 6C is executed (029) to form the two digit channel number of the desired channel and the data is set in accordance with the depressed key, i.e., the particular digit key. After the complex message flag is cleared (024), a remote control message with the preamble set to either TV or VCR (in accordance with step 015 or 017) and with the data set to the particular digit of the channel number corresponding to the depressed key is transmitted (starting at point B).

If the depressed key was either a CU or CD key (030), the next channel in the skip list is located by executing a channel scanning portion of the program (031) shown in detail in FIG. 6D. Thereafter a remote control message with the preamble set to either TV or VCR and the data set to the channel number of next channel in the skip list is transmitted (starting at point B). The remote control message will be a complex message including either CU or CD (depending on whether CU or CD was depressed). As earlier noted, if the selected device was the television receiver, this causes the audio to be muted while the new channel is being tuned.

Figure 6E:
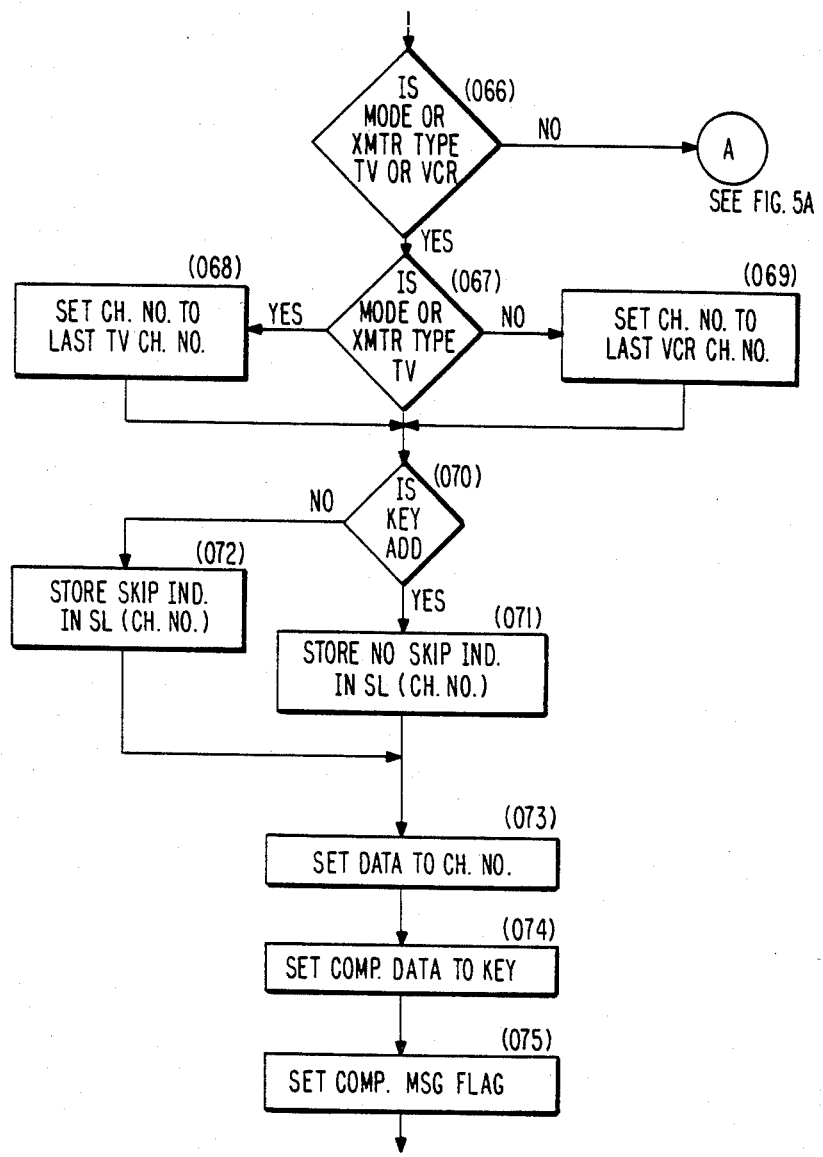

If the depressed key was either the ADD or ERASE key (032), the last channel selected is added or removed from the skip list by executing a channel skip list set up portion of the program (033) shown in detail in FIG. 6E. Thereafter, the remote control message with the preamble set to either TV or VCR and the data set to the channel number of the last channel selected is transmitted. In response to this remote control message generated, the last channel is again tuned. If the last device selected was the television receiver, the image will temporarily disappear and then reappear as the last channel is returned. This indicates to a user that the desired action (i.e., either the addition or removal of the selected channel from the skip list) has taken place.

It is noted that once a channel is removed from the skip list, it cannot be selected by means of either the CU or CD keys and therefore it can only be added again if it is first directly entered by means of the digit keys.

When a channel is added or deleted, the remote message is complex and it includes, in addition to the channel number, the command "add" or "erase". This is desirable since it allows a skip memory included in television receiver or video cassette recorder to be set up when the skip list in the remote control transmitter is set up. The inclusion of a skip memory in the television receiver or video cassette recorder allows channels to be selected at the device itself in the same manner as with the remote control transmitter. To that end, as shown by way of example for the television receiver in FIG. 4, a keyboard 128 for entering channel selection commands, as well as other function commands such as "on", "off", "volume up" and "volume down" and a memory 130 for storing the skip list are coupled to microcontroller 124. Since supply voltage is always provided by standby power supply 126, memory 130 may be included within microcontroller 124 if desired.

If the depressed key was none of the MUTE, VU, VD, CU, CD, ADD or ERASE keys, the data is set in accordance with the depressed key (023), the complex message flag is cleared (024) and the remote control message is transmitted (starting at point B).

The flow chart of the portion of the program for reading strap configuration 36 (shown in FIG. 3) to determine the transmitter type is shown in FIG. 6A.

As is indicated in FIG. 3, in strap configuration 36 an input terminal (IN) can be connected either to the supply voltage ($V_{cc}$) conductor (a logic "1"), the reference voltage (ground) conductor (a logic "0"), a first output terminal (OUT 1) or to a second output terminal (OUT 2). The four possible transmitter configurations are identified as follows:

TV if IN tied to "1"

UR if IN tied to "0"

VCR if IN tied to OUT 1

VD if IN tied to OUT 2 In general, the number of remote control types that can be defined by such a strap configuration where an input terminal is tied to either the supply voltage conductor, the reference voltage conductor or to an output terminal is:

2 + number of output terminals to which the input terminal may be tied

Basically, as is indicated in FIG. 6A, to determine the transmitter type, output terminals OUT 1 and OUT 2 are sequentially set to different logic states and the state of input terminal IN is examined at each logic state.

The flow chart for the portion of program for forming and transmitting the remote control message is shown in FIG. 6B. Before the remote control message is transmitted, the key that was depressed is stored in a memory location of internal RAM 60 identified as LAST KEY (034). Thereafter, the contents of a complex message flag register are examined (035) to determine the type of remote control message to be transmitted. The contents of the LAST KEY memory location are transferred to a corresponding memory location of external RAM 38 before the program ends (see 006 of FIG. 5A) for future reference in determining the preamble and data of a remote control message (see 025 of FIG. 5B).

If the complex flag has not been set (036), the remote control message has the form:

PREAMBLE + DATA + PREABLE + DATA where the "bars" indicate that each bit of the corresponding digital word is complemented. Such type remote control message in which the preamble and data are repeated in complemented form is conventionally used in remote control systems to reduce the possibility of error. After the remote control message has been transmitted, the program returns to wait for the next key depression (at point A of FIG. 5A).

If the complex message flag has been set (037), the remote control message has the form:

PREAMBLE+DATA+PREAMBLE+-
DATA+PREAMBLE+COMPLEX
DATA+PREAMBLE+COMPLEX DATA.

The manner in which the complex data is formed will be discussed with respect to the flow chart portions shown in FIGS. 6D and 6E.

After the complex remote control message has been transmitted, the complex message flag is cleared (038) and the program returns to wait for the next key depression (at point A of FIG. 5A).

The flow chart portion for transmitting the tens and units digits of a channel number when a channel is directly selected is shown in FIG. 6C. If the transmitter type or mode (device to be controlled) is TV or VCR (039), if a digit key has been depressed, "½ entry" flag register is examined (040). If the ½ entry flag is not set, indicating that the depressed digit key corresponds to the tens digit, the digit key is stored in a memory location for the tens digit of the channel number (041). The ½ entry flag is then set (042) and a timer comprising an internal counter, is started (043). Thereafter, the digit corresponding to the depressed key is transmitted as the data portion (see 023 of FIG. 5B) of a remote control message having a preamble set to either TV or VCR in accordance with the device selected for control in the case of a unified transmitter (see 015 of FIG. 5A) or the transmitter type (see 017 of FIG. 5A).

If a second digit key is depressed before the timer has reached a predetermined count corresponding to a predetermined time (see 043A and 044 of FIG. 5A) the program will again reach the portion shown in FIG. 6C and as a result a new channel will be selected as described below. However, if the timer has reached the predetermined count, i.e., if the time is finished (044 of FIG. 5A) the program ends (006 of FIG. 5A) without the selection of a new channel. The purpose of this is to reduce the possibility of incorrect channel selections. That is, if the user does not complete the direct entry of a channel number by depressing a second digit key, it is assumed that it was because it was realized by the user that the first digit key depressed was incorrect or that the depression of the first digit was by mistake.

If a second digit key is depressed, the ½ entry flag will have been previously set (040) to indicate that the second depressed digit key corresponds to the tens digit of the channel number of the desired channel. In that case, the digit corresponding to the depressed digit key is stored in a memory location for the units digit of the channel number (045), the ½ entry flag is cleared (046) and the timer is cleared (047). Thereafter, the channel number is stored in the memory location for the last TV channel if the transmitter type or mode (device to be controlled) is TV (048 and 049) or in the memory location for the last VCR channel if the transmitter type or mode is VCR (049 and 050). Then, the units digit is transmitted in the same manner as the tens digit of the channel number.

The flow chart for the channel scanning portion of the program is shown in FIG. 6D.

While separate skip lists could be used for the television receiver and the video cassette recorder, only a single skip list is used for two reasons. The first reason is that in a given reception area, the preferred channels for the television receiver and the video cassette recorder will for the most part be the same. Accordingly, only a single skip list is required. The second reason is related to the fact that as earlier noted for reasons of operational speed, the contents of external RAM 38 are loaded into internal RAM 60 of microcontroller 32 after a key has been depressed. While an internal RAM such as RAM 60 of most inexpensive microprocessors such as the COP420L is large enough to store a single skip list and the other information transferred from external skip list 38, it is not large enough to store two skip lists.

In order to enable a single skip list to be employed, the channel number for the last TV channel selected is used as the starting point for the channel scanning operation to locate next TV channel and the channel number for the last VCR channel selected is used as the starting point for the channel scanning operation to locate the next VCR channel.

Now with specific attention to the flow chart shown in FIG. 6D, if the transmitter type or mode (device to be controlled), is TV or VCR (051), if one of the CU or CD keys has been depressed, an examination is made to determine which one of the two (TV or VCR) it is (052). If the transmitter type or mode is TV, the channel number is set to the last TV channel number (053). If the transmitter type or mode is VCR, the channel number is set to the last VCR channel number (054).

If the CU key was depressed (055) the channel number is increased by one (056U). If the highest channel number has been exceeded (057U), the channel number is set to the lowest channel number (058U) to continue the scanning operation within the range of legitimate channel numbers. Thereafter, the memory location of the skip list for the present channel number, indicated in the flow chart by SL (CH.NO.), is examined to determine if it contains a "skip" indication, e.g., a logic "0" (059). If the memory location of the skip list for the present channel number contains a skip indication, the channel number is again increased until a "no skip" indication, e.g., a logic "1", is found. Essentially, the same operation occurs if the CD key was depressed, except, of course, that the channel number is decreased (see 055, 056D, 057D, 058D and 059).

Once a no skip indication is found, the corresponding channel number is stored in the memory location for the last TV channel if the transmitter type or mode is TV (060 and 061) or stored in the memory location for the last VCR channel if the transmitter type or mode is VCR (060 and 062). Then, the data is set to the channel number (063), the complex data is set to the depressed key, i.e., either CU or CD (064) and the complex message flag is set (065). Thereafter, the complex remote control message is transmitted with the appropriate preamble, i.e., either TV or VCR.

The flow chart for the add and erase portion of the program is shown in FIG. 6E. If the transmitter type or mode is TV or VCR (066) if one of the ADD or ERASE keys has been depressed, the channel number is set to the last TV channel if the transmitter type or mode is TV (067 and 068) or set to the last VCR channel of the transmitter type or mode is VCR (067 and 069). If the ADD key was depressed (070), a "no skip" indication is stored in the memory location of the skip list for the present channel number (071). If the ERASE key was depressed (070), a "skip" indication is stored in the memory location of the skip list for the present channel (072). Then, the data is set to the present channel number (073), the complex data is set to the depressed key, i.e., either ADD or ERASE, (074) the complex message flag is set (075). Thereafter, the complex remote control message is transmitted.

Figure 7:
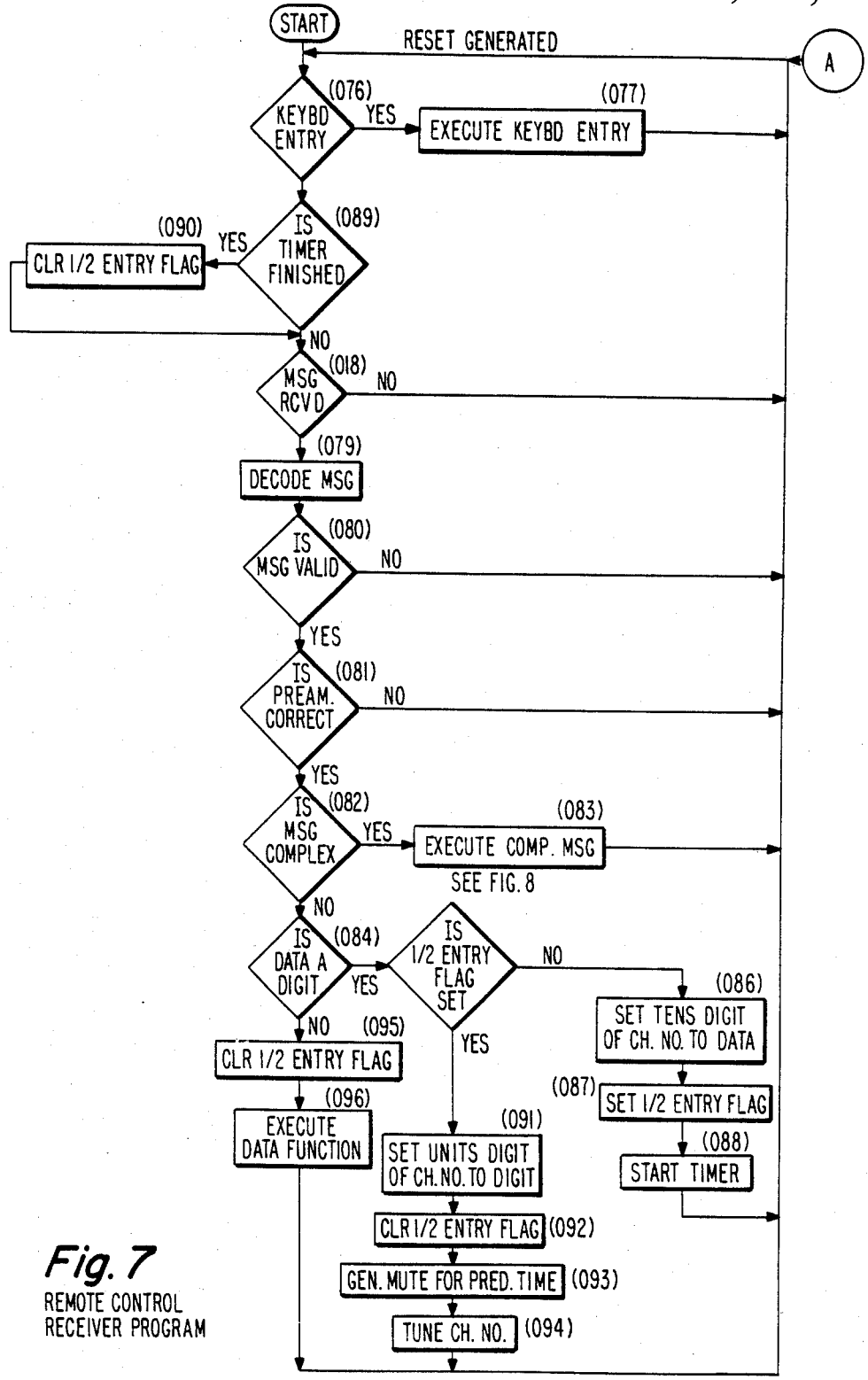
FIGS. 7 and 8 show, in flow chart form, the control program for the microcontroller included within the remote control receiver shown in FIG. 4.
Figure 8:
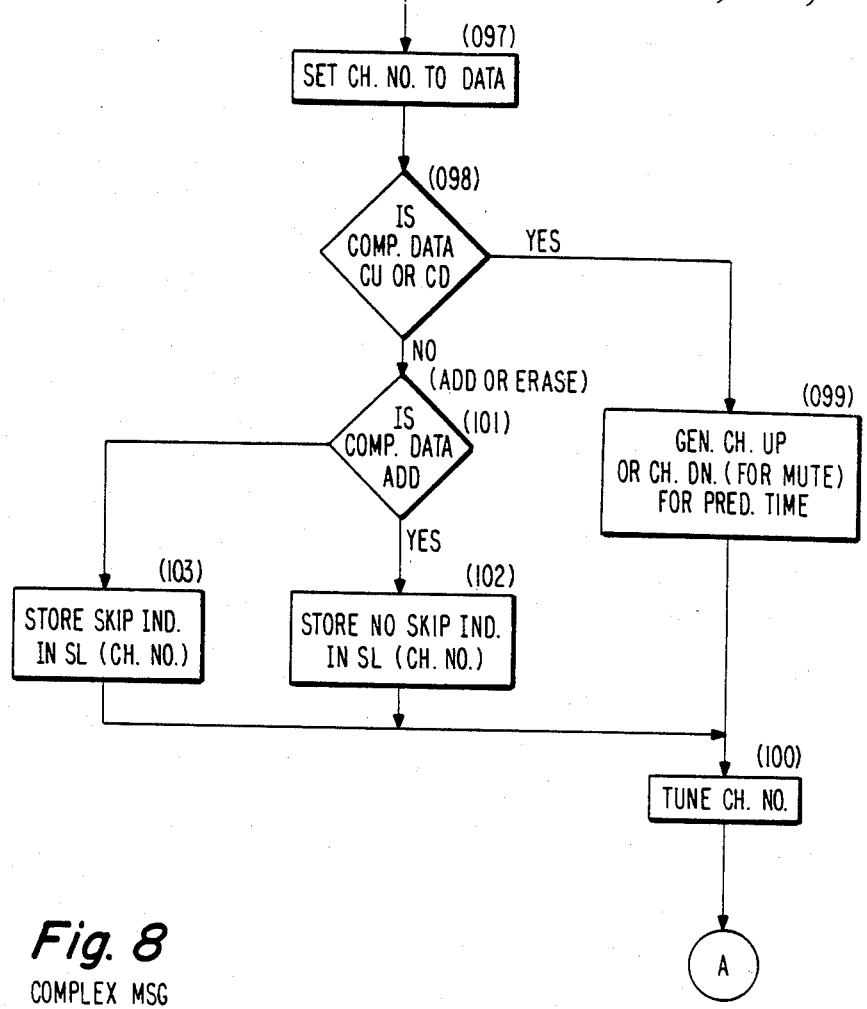

The flow chart for the program for processing received remote control messages in the remote control receiver portion of the television receiver shown in FIG. 4 is shown in FIGS. 7 and 8. As shown in FIG. 7, the program is started when supply voltage is initially provided from standby power supply 126 and a reset signal is generated by a power up detector 132 and applied to the reset input of microcontroller 124. The input terminals of microcontroller 124 coupled to keyboard 128 are monitored to determine if a keyboard entry has been made (076) and if this is the case, executes the appropriate function (077). The input terminal of microcontroller 124 coupled to the output of demodulator 122 is monitored to determine if a remote control message has been received (078). If a remote control message has been received, it is decoded (079) to determine the preamble, data and complex data, if any. The validity of the remote control message is determined by comparing the complemented and uncomplemented portions (080). The preamble is examined to determine if it corresponds to the device being controlled (081). If the message is not valid (080) or the preamble is incorrect (081) the program returns (to point A) to wait for the next keyboard entry or remote control message.

If the remote control message is complex (082) the complex memory is processed (083) as shown in the flow chart of FIG. 8.

If the data portion of the remote control message represents a digit (084) the channel number is formed similar to that in which the channel number is formed in the remote control transmitter (085-095). When the complete channel number has been formed, a mute signal is generated for a predetermined time long enough for the new channel to be tuned (093) and the channel number is applied to tuner control unit 112 in order to cause the corresponding channel to be tuned (094).

If the data does not represent a digit, the function represented by the data is executed (096).

The portion of the program for executing complex remote control messages is shown in FIG. 8. Since the data portion of a complex remote control message represents a channel number, the channel number is set to the data (097).

If the complex data portion of the remote control message represents CU or CD (098), a mute signal is generated for the predetermined time (099) and thereafter the channel corresponding to the channel number is caused to be tuned (100).

If the complex data portion of the remote control message represents ADD or ERASE (098), the respective "skip" or "no skip" indication is stored in the memory location for the channel number (101-103). Thereafter the channel corresponding to the channel number is caused to be tuned (100).

The program for processing remote control messages for the video cassette recorder and video disk player are similar to that for the television receiver except in the case of the video cassette recorder the mute signal need not be generated and in the case of the video disk both the mute signal and the channel tuning commands need not be generated. However, if desired to reduce inventory and testing expenses as in the case of the remote control transmitters, the same program may be used for all the devices. In that case, the preambles serve to route the program to portions for executing commands with which the particular device is concerned.

I claim:

1. Apparatus for controlling first and second tuners, comprising:

first selection means for causing consecutive channels to be tuned by said first tuner when activated by a user;

second selection means for causing consecutive channels to be tuned by said second tuner when activated by a user;

a plurality of addressable skip memory means each corresponding to a respective one of said channels, each for storing a skip or no-skip indication indicating whether or not the respective channel should be skipped or not skipped during channel selection;

first last channel memory means for storing the last channel tuned by said first tuner;

second last channel memory means for storing the last channel tuned by said second tuner;

control means for (1) responsive to the activation of either one of said first or second selection means, addressing said plurality of skip memory means in consecutive channel number order from the one of said plurality of skip memory means corresponding to an initial channel and responsive to the contents of a presently addressed one of said plurality of skip memory means, causing the skip memory means corresponding to the next channel to be addressed if said presently addressed one of said plurality of skip memory means contains a skip indication or stopping the addressing if said presently addressed one of said plurality of skip memory means contains a no-skip indication; (2) responsive to the activation of said first selection means and the contents of said first last channel memory means, setting said initial channel to the last channel tuned by said first tuner and responsive to the activation of said second selection means and the contents of said second last channel memory means, setting said initial channel to the last channel tuned by said second tuner; and (3) causing the storage of the channel corresponding to the one of said plurality of skip memory means at which said addressing is stopped in said first last channel means as said last channel tuned by said first tuner if said first selection means was activated or in said second last channel memory means as said last channel tuned by said second tuner if said second selection means was activated.

2. The apparatus recited in claim 1 wherein:

said control means is included within a microcontroller including an internal data memory having a plurality of memory locations, said plurality of skip memory means and said first and second last channel memory means comprising respective memory locations of said internal data memory;

an external memory is coupled to said microcontroller; and said control means (4) transfers the contents of the memory locations of said internal memory corresponding to said plurality of skip memory means and said first and second last channel memory means to respective memory locations of said external memory after the addressing of said plurality of skip memory means is stopped; and (5) transfers the contents of said external memory to said internal memory when one of said first and second selection means is activated.

3. The apparatus recited in claim 2 further including:

power source means for supplying at least one operating voltage for said microcontroller and said external memory switch means for selectively coupling said power source means to said microcontroller after either one of said first or second selection means is actived; and coupling means for continuously coupling said power source means to said external memory.

4. Apparatus for controlling first and second tuners, comprising:

first and second selection means;

a plurality of addressable skip memory means each for storing a skip indication indicating that a corresponding channel is not to be tuned or a no-skip indication indicating that a corresponding channel is to be tuned;

first last channel memory means for storing a representation of the last channel tuned by said first tuner;

second last channel memory means for storing a representation of the last channel tuned by said second tuner;

control means for (1) responsive to the activation of said first selection means and the contents of said first last channel memory means, addressing said plurality of skip memory means in a given order from the one of said plurality of skip memory means corresponding to the last channel tuned by said first tuner or responsive to the activation of said second selection means and the contents of said second last channel memory means, addressing said plurality of skip memory means in said given order from the one of said plurality of skip memory means corresponding to the last channel tuned by said second tuner; (2) responsive to the contents of a presently addressed one of said plurality of skip memory means, causing the next one of said plurality of skip memory means in said given order to be addressed if said presently addressed one of said plurality of skip memory means contains a skip indication or stopping the addressing of said plurality of skip memory means if said presently addressed one of said plurality of skip memory means contains a no-skip indication; and (3) causing the storage of the channel representation corresponding to the one of said plurality of skip memory means at which addressing was stopped to be stored in said first last channel memory means as said representation of said last channel tuned by said first tuner if said first selection means was activated or in said second last channel memory means if said second selection means as said representation of said last channel tuned by said second tuner was activated.

* * * * *